(12) United States Patent
Boor

(10) Patent No.: US 7,221,766 B2
(45) Date of Patent: May 22, 2007

(54) MICROPHONE INPUT BUFFER BIASING CIRCUIT

(75) Inventor: Steven E. Boor, Plano, TX (US)

(73) Assignee: Knowles Electronics, LLC, Itasca, IL (US)

(*) Notice: Subject to any disclaimer, the term of this patent is extended or adjusted under 35 U.S.C. 154(b) by 724 days.

(21) Appl. No.: 10/411,556

(22) Filed: Apr. 10, 2003

(65) Prior Publication Data

US 2003/0194100 A1 Oct. 16, 2003

Related U.S. Application Data

(60) Provisional application No. 60/372,547, filed on Apr. 15, 2002.

(51) Int. Cl.
*H04R 3/00* (2006.01)

(52) U.S. Cl. ..................... 381/111; 381/120

(58) Field of Classification Search ........ 381/111–115, 381/122, 120, 121; 330/277, 310, 296
See application file for complete search history.

(56) References Cited

U.S. PATENT DOCUMENTS

| 3,512,100 | A | 5/1970 | Killion et al. |
| 4,151,480 | A | 4/1979 | Carlson et al. |
| 5,083,095 | A | 1/1992 | Madaffari |
| 5,097,224 | A | 3/1992 | Madaffari et al. |
| 5,589,799 | A | 12/1996 | Madaffari et al. |

FOREIGN PATENT DOCUMENTS

| EP | 0 880 225 A2 | 11/1998 |
| EP | 0 969 695 A1 | 1/2000 |
| EP | 1 061 427 A1 | 12/2000 |
| GB | 1 219 299 | 1/1971 |

OTHER PUBLICATIONS

European Search Report for Application No. 03 25 2383.9 dated Jun. 5, 2003.

*Primary Examiner*—Ping Lee
(74) *Attorney, Agent, or Firm*—Marshall, Gerstein & Borun LLP

(57) ABSTRACT

An input biasing circuit for a microphone is disclosed. The circuit includes an input and an output. An input transistor is connected between the input and the output and to a biasing circuit. The biasing circuit DC biases the gate terminal of the input transistor. A resistor operably connected to, and cooperating with the input transistor, provides a buffered version of a received microphone transducer signal to the output.

8 Claims, 4 Drawing Sheets

000
MICROPHONE INPUT BUFFER BIASING CIRCUIT

CROSS-REFERENCE TO RELATED APPLICATIONS

This application claims the benefit of U.S. Provisional Patent Application Ser. No. 60/372,547, entitled "Microphone Input Buffer Biasing Circuit," filed Apr. 15, 2002. This application is incorporated herein by reference.

FEDERALLY SPONSORED RESEARCH OR DEVELOPMENT

Not Applicable.

TECHNICAL FIELD

The present invention relates to microphones. More specifically, the present invention is directed to a biasing circuit utilized in an input buffer for a microphone.

BACKGROUND OF THE INVENTION

Hearing aid performance continues to be enhanced by technological advances in audio signal processing capabilities, e.g. primarily via digital signal processing, environmental adaptation, programmability, and noise cancellation techniques. As part of these on-going advancement efforts, hearing aid manufacturers often request performance improvements from suppliers of microphone transducers.

One performance limitation of today's assisted-listening systems and/or devices, e.g., hearing aid—often associated with noise canceling directional hearing aids utilizing high performing miniature microphones—is caused by the substantial reduction of the impedance of the anti-parallel diode biasing circuitry commonly implemented at the input of the microphone buffer. The anti-parallel diode biasing circuitry coupled to the signal input of the microphone will effectively limit the transducer output to the turn-on voltage, $V_{on}$, of the diodes, e.g., +/−0.3V, relative to the zero-bias potential.

Although diode biasing has been a major factor leading to significantly improved microphone noise performance, it has been noted that diode biasing also results in undesirable audible artifacts and performance degradation in directional hearing aids. Frequently, such performance degradation occurs under loud acoustic transient conditions, i.e., when the signal level voltage from the transducer would normally exceed $V_{on}$.

Thus, an alternative input biasing configuration is desirable to adapt the microphone buffer to accommodate environmental conditions for alleviating these audible artifacts without compromising overall noise performance in the transducer.

SUMMARY OF THE INVENTION

One embodiment of the present invention is directed to an input buffer biasing circuit for a microphone assembly. The circuit comprises an input transistor being operably connected between an input and an output. A biasing circuit is operably connected to the input and the input transistor. A resistor is operably connected to the input transistor and the output. The resistor and the input transistor cooperate to provide a buffered version of a voltage signal received at the input to the output.

It is an object of the present invention to provide an input biasing circuit for a microphone buffer without requiring the use of large value, e.g., Giga-ohm, external resistors.

Another object of the present invention is to limit the impedance reduction and the amount of current flow through an input biasing circuit of an input buffer for an assisted-listening system and/or device, e.g., hearing aid.

Yet another object of the present invention is to provide the ability to completely integrate the current limiting circuitry of an input buffer onto an integrated circuit.

Another further object of the present invention is to reduce manufacturing costs, improve reliability, and improve hearing aid performance by reducing and/or eliminating the need to use large, external, discrete, components in a microphone input buffer for the hearing aid.

These and other aspects and attributes of the present invention will be discussed with reference to the following drawings and accompanying specification.

BRIEF DESCRIPTION OF THE DRAWINGS

FIG. 3a depicts a partial schematic drawing of one embodiment of the input buffer biasing circuit of the present invention utilizing the biasing circuit shown in FIG. 2a;

DETAILED DESCRIPTION OF THE INVENTION

Figure 1A:
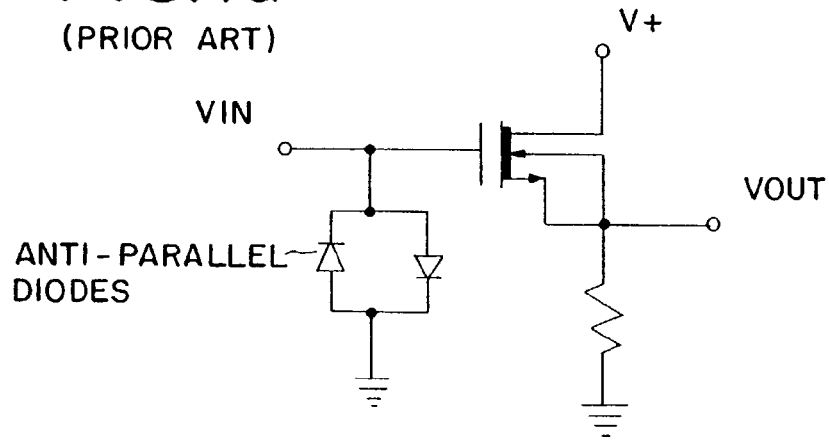
FIG. 1a depicts a prior art input buffer circuit for a microphone incorporating a commonly known input biasing technique utilizing anti-parallel input bias diodes to attain ultra-low noise circuit performance.

While this invention is susceptible of embodiment in many different forms, there is shown in the drawings, and will be described herein in detail, specific embodiments thereof with the understanding that the present disclosure is to be considered as an exemplification of the principles of the invention and is not intended to limit the invention to the specific embodiments illustrated.

Figure 1B:
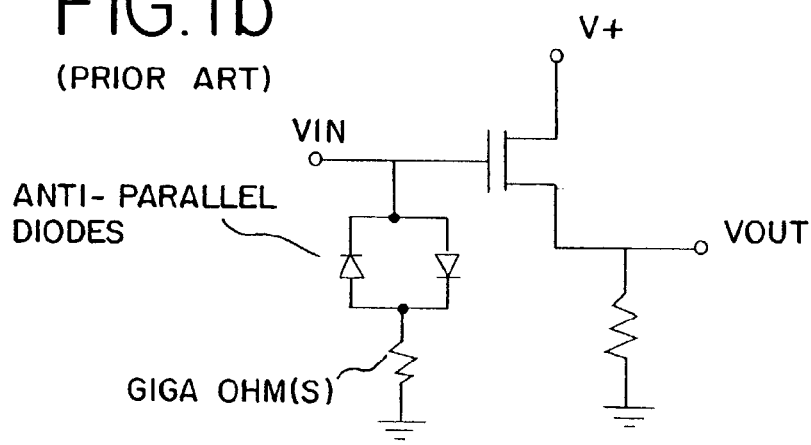
FIG. 1b depicts another prior art input buffer circuit for a microphone utilizing an externally connected Giga-ohm valued resistor to introduce a lower limit to the impedance of the input biasing circuitry.

One known embodiment of an input buffer circuit for a microphone commonly utilized to obtain ultra-low noise circuit performance is shown in FIG. 1a. The circuit utilizes anti-parallel input bias diodes for input biasing the input transistor of the buffer circuit. Another commonly used technique to input bias the input transistor incorporates externally connected Giga-ohm resistor(s) to introduce a lower limit to the impedance of the input biasing circuit, such as shown in FIG. 1b. See also, U.S. Pat. Nos. 5,097,224 and 5,589,799. Although adequate for biasing input buffer circuits, the design of these input buffers require costly manufacturing processes that may adversely affect the performance and reliability of the input buffer circuit.

Figure 1C:
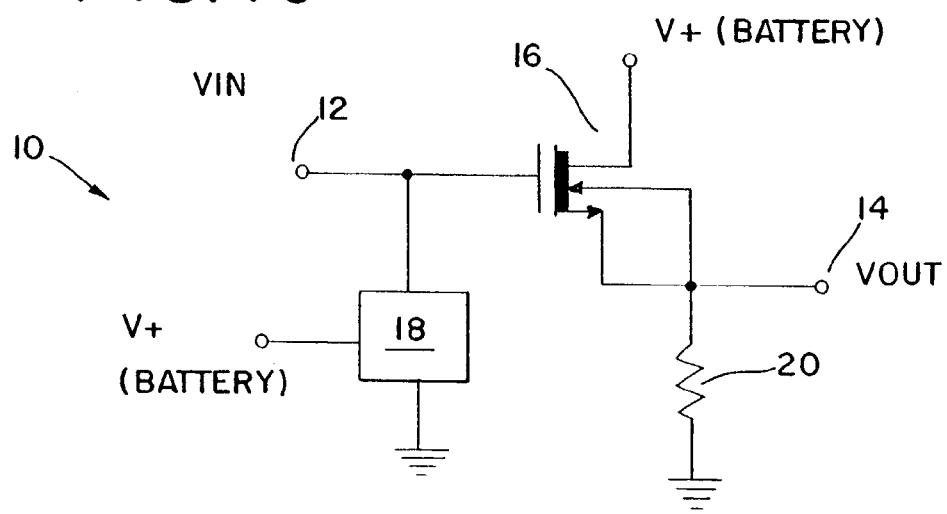
FIG. 1c depicts an input buffer circuit for a microphone in accordance with one embodiment of the present invention.

An input buffer biasing circuit 10 of the present invention is illustrated in FIG. 1c. The circuit 10 includes a signal input terminal 12 operably connected to a signal output terminal 14. The circuit 10 further includes an input transistor 16 operably connected to the input 12 and output 14. A biasing circuit 18 is connected to the input 12 and the input transistor 16. A resistor 20 connects the output terminal 14 and the input transistor 16 to ground.

The biasing circuit 18 DC biases the gate terminal of the input transistor 16. The input transistor 16 buffers the impedance between the high impedance of a transducer of an electret microphone (not shown) and the relatively lower impedance of a hearing aid circuit (not shown), e.g., amplifier, signal processor. The resistor 20 cooperates with the input transistor 16, preferably Depletion NMOS, to provide the desired amount of voltage signal, e.g., received from a transducer, to the hearing aid circuit.

Figure 2A:
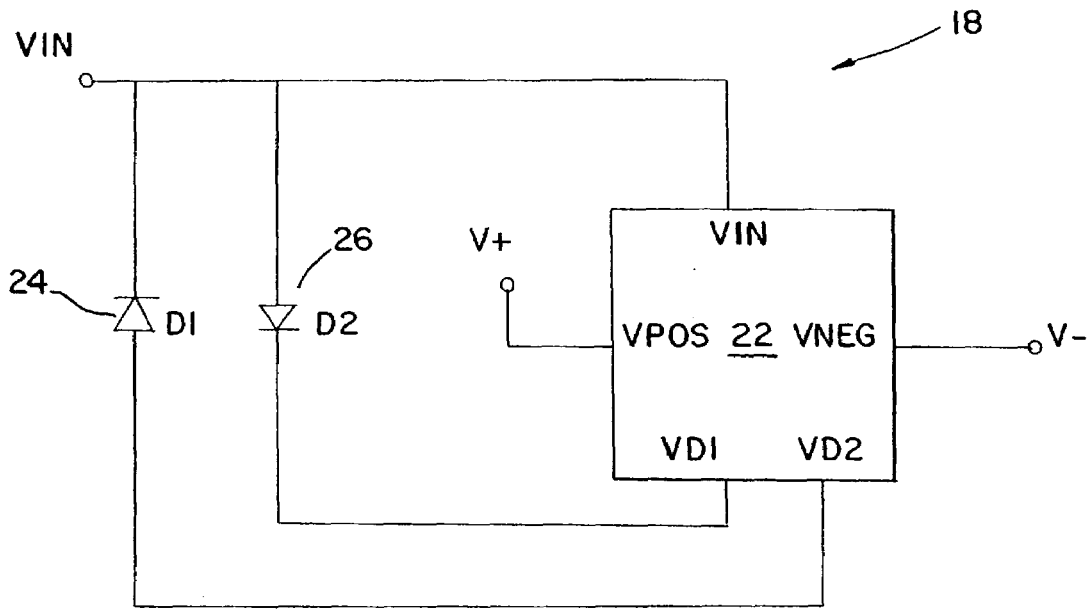
FIG. 2a depicts one embodiment of a biasing circuit of the present invention.

FIG. 2a depicts one embodiment of the biasing circuit 18. A current limiter 22 is operably connected to a pair of diodes 24, 26. Each diode 24, 26 is operably connected in series to the current limiting device 22. The current limiting device 22 limits the amount of current flowing into and out of the biasing circuit 18 and through the diodes 24, 26. Without some means of limiting the current through the input biasing circuitry, increased current levels through the input biasing circuitry (resulting from an increase in the input signal voltage) will adversely affect the transient recovery characteristics of a completed microphone assembly, usually resulting in undesirable artificial acoustic sound artifacts.

Figure 3A:
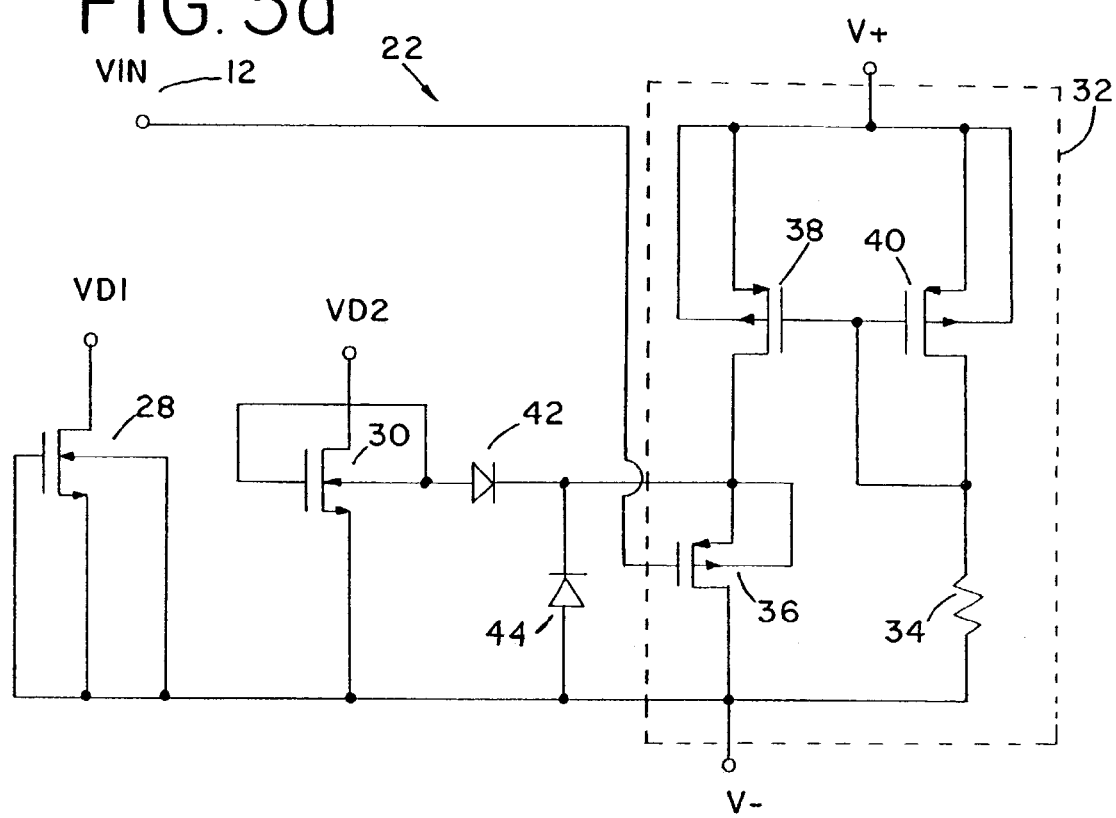

One embodiment of the current limiter 22 capable of being utilized with the biasing circuit 18 of the present invention is depicted in FIG. 3a. Since each diode 24, 26 conducts current in one direction only, a pair of transistors 28, 30 are utilized for current limiting in each direction, i.e., during forward biasing of each respective diode. A buffering circuit 32 is operably connected to the input terminal 12 and the first and second transistors 28, 30 to buffer the parasitic junction capacitance associated with isolating the P-well regions of the transistors. Preferably, the first and second transistors 28, 30 are Natural NMOS type devices and have a threshold voltage near 0 volts. The first and second transistors 28, 30 perform the current limiting function of the biasing limiter circuit 18. The buffer circuit 32 is comprised of a resistor 34 and three operably connected enhancement PMOS transistors 36, 38, 40.

FIG. 3a also shows a pair of diodes 42, 44 that are parasitic structures in the physical implementation of the current limiting circuitry. The capacitance associated with these parasitic diodes 42, 44 are guarded-out by the PMOS buffer portion of the circuit.

Figure 4:
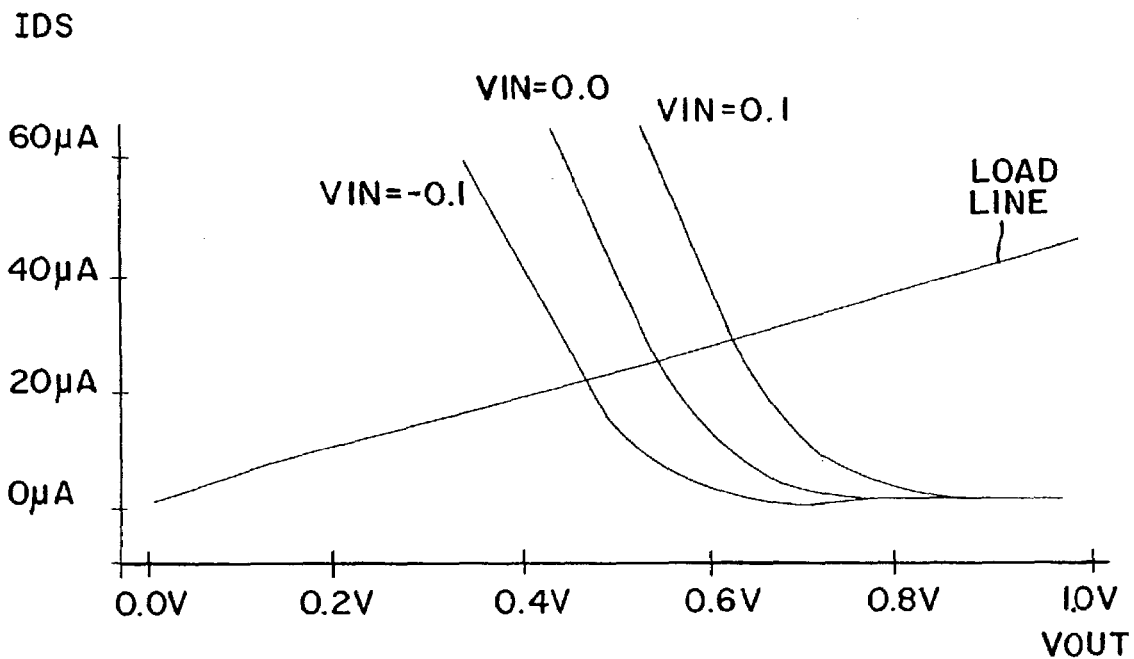
FIG. 4 is a graph depicting the square law characteristic of the buffer input transistor 16 in FIG. 1c; and, FIG. 5 is a graphical comparison of electrical characteristics of various input biasing circuits for a microphone.

The square law characteristic of the input transistor 16 for the input buffer 10 of the present invention is shown in FIG. 4. Current flowing through the input transistor 16 from its drain to its source, $I_{DS}$, is represented on the vertical axis of the graph. Voltage at the output terminal 14 is represented on the horizontal axis of the graph. The parabolic curves in the center portion of the graph represent the input transistor $I_{DS}$ characteristic for various input voltages, i.e., −0.1, 0.0, and 0.1 volts. The intersection of the load line of the resistor 20 with the parabolic curve represents the drain-source current of the input transistor 16 and the voltage at the terminal output 14.

Figure 2B:
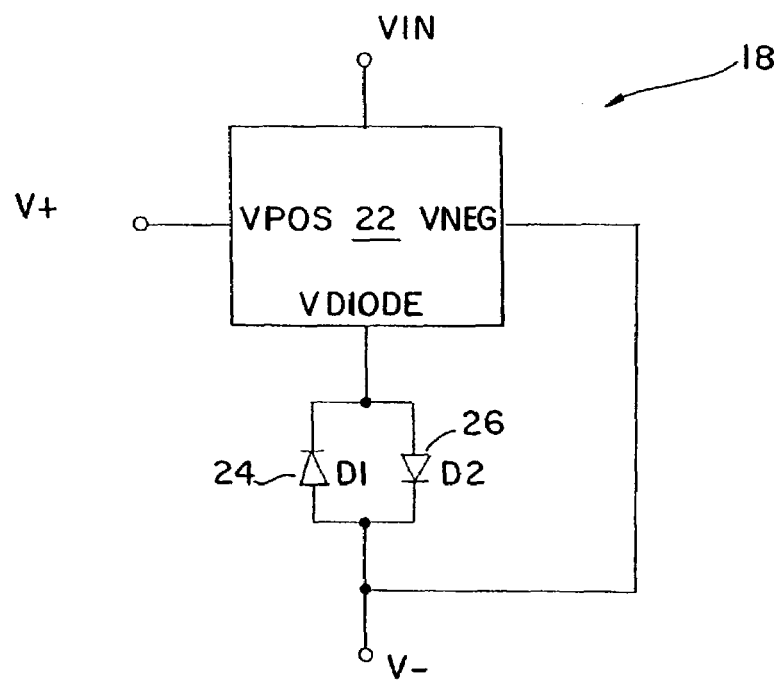
FIG. 2b depicts another embodiment of a biasing circuit of the present invention.
Figure 3B:
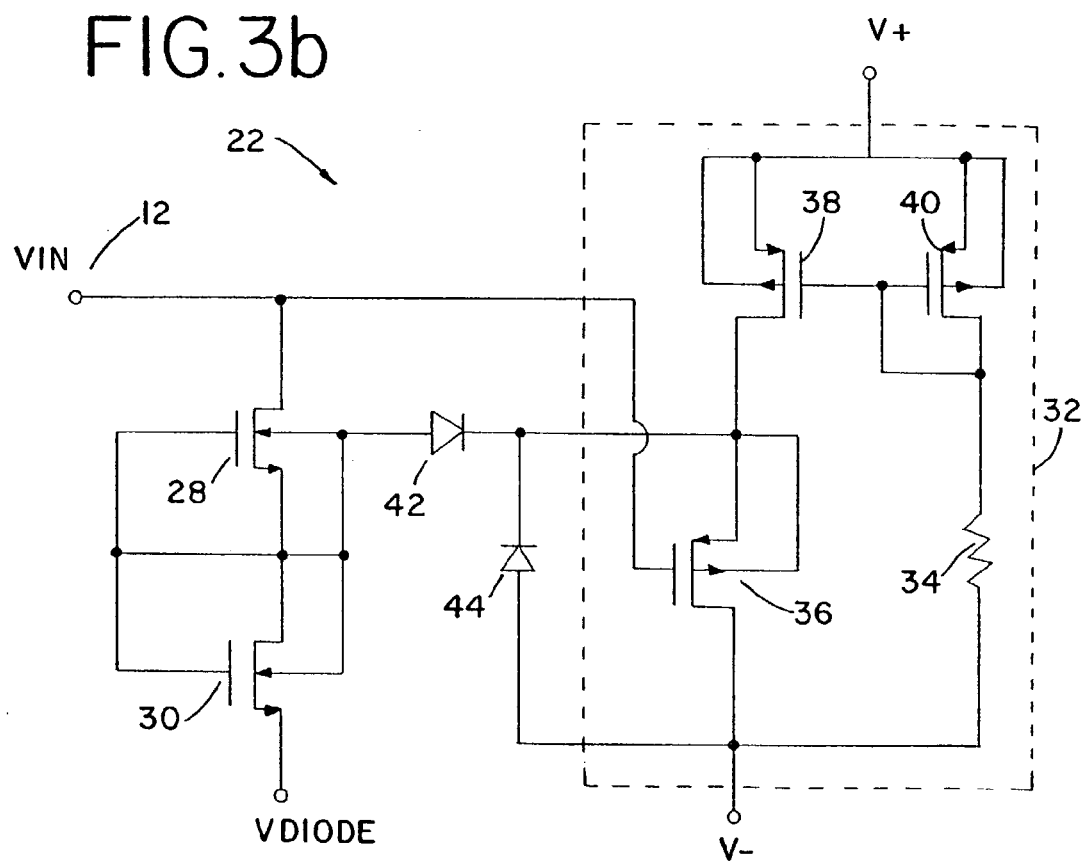
FIG. 3b depicts a partial schematic drawing of another embodiment of the input buffer biasing circuit of the present invention utilizing the biasing circuit shown in FIG. 2b.

An alternative embodiment of the current limiter 22 capable of being utilized with the biasing circuit 18 of the present invention is depicted in FIGS. 2b and 3b. The current limiter 22 shown in FIG. 2b is operably connected to a pair of anti-parallel diodes 24, 26. Preferably, the current limiter 22 is a bi-directional current limiting circuit that symmetrically limits the amount of current flowing into and out of the biasing circuit 18 and through the anti-parallel diodes 24, 26. As seen in FIG. 3b, the first transistor 28 and second transistor 30 are operably connected between the input terminal 12 and the pair of anti-parallel diodes 24, 26 of the biasing circuit 18 of FIG. 2b. Since each diode 24, 26 conducts current in one direction only, the pair of transistors 28, 30 are operably connected to the anti-parallel diodes for current limiting in each direction, i.e., during forward biasing of each respective diode. Referring again to FIG. 3b, the buffering circuitry 32 includes a resistor 34 and three operably connected enhancement PMOS transistors 36, 38, 40, and is operably connected to the input terminal 12 and the first and second transistors 28, 30 to buffer the parasitic junction capacitance associated with isolating the P-well regions of the transistors.

Although the utilization of impedance limiting in a biasing circuit for an input buffer has been previously known (see FIG. 1b), the present invention is structurally different and offers significant advantages over biasing circuits of prior art input buffers. Utilization of the input transistor 16 in cooperation with the Natural MOS transistors 28, 30 allows for the incorporation of all the input buffer circuit components onto the same integrated circuit, which lowers manufacturing costs, improves reliability, and reduces the parasitic capacitances that degrade the overall microphone sensitivity.

Figure 5:
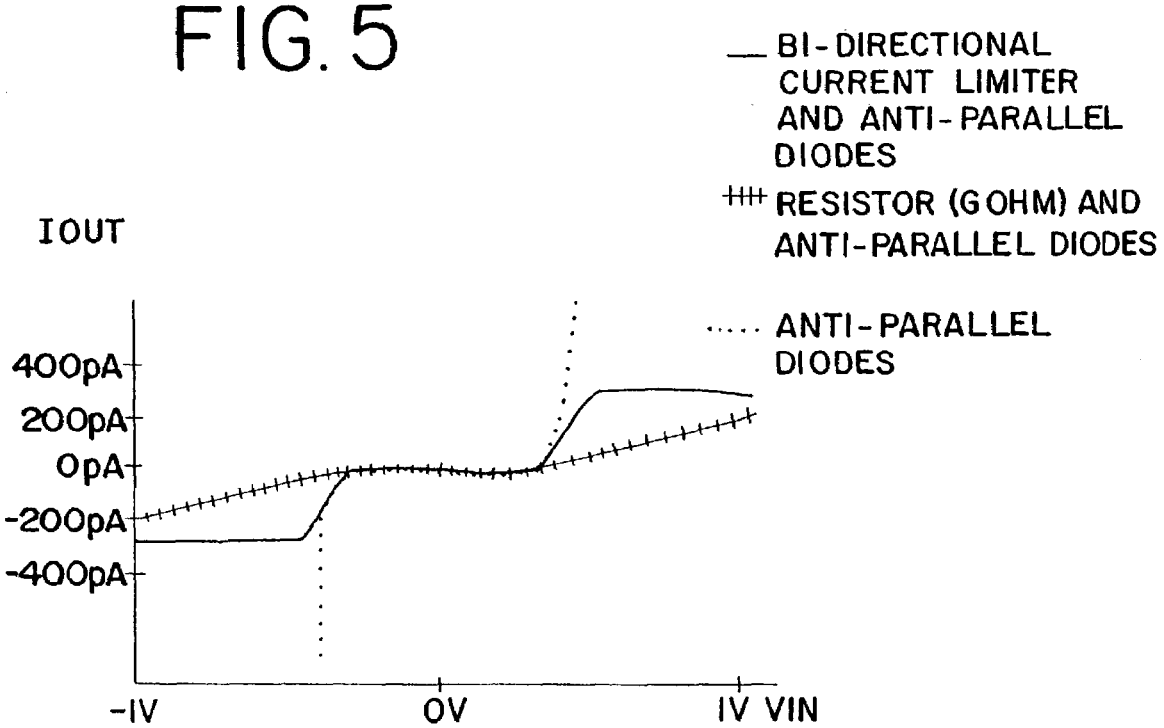

The relationship between the output current, $I_{out}$, and the input voltage, $V_{in}$, for the biasing circuit 18 of the present invention and other known biasing circuits that incorporate anti-parallel diodes is shown in FIG. 5. The solid line represents the preferred embodiment of the present invention. The remaining lines represent two commonly known art input bias circuits—the dotted line represents an input biasing circuit utilizing the anti-parallel diodes alone, e.g., FIG. 1a, and the scored line represents an input buffer circuit utilizing the anti-parallel diodes in series with a discrete resistor(s) in the Giga-ohm range, e.g., FIG. 1b. It is shown in FIG. 5 that the input buffer 10 of the present invention is functionally comparable to the input bias circuits used in FIG. 1b, in that it effectively limits the current through the input bias circuitry to substantially the same level. It has been found that limiting the current flow through the input biasing circuitry to pico-Amp levels, and not limiting the impedance reduction of the input biasing circuitry per se, is the most critical factor in eliminating the acoustic artifact problem for large transient sound inputs. Moreover, the buffer circuit 10 of the present invention includes the additional economic, reliability, and performance advantages that result from the ability to completely integrate all circuitry onto the same IC.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. An input buffer circuit for a microphone, the input buffer circuit comprising:
   an input for receiving a voltage signal;
   an input transistor being operably connected between the input and an output;

a biasing circuit including a current limiter being operably connected to the input and the input transistor, the biasing circuit for DC biasing the gate terminal of the input transistor; and, a resistor being operably connected to the input transistor and the output, the resistor and the input transistor cooperating to provide a buffered voltage signal to the output, wherein the biasing circuit includes a pair of anti-parallel diodes being operable connected to the input, and the current limiter comprise a first transistor and a second transistor wherein the first and second transistors cooperate to limit current flowing through the pair of anti-parallel diodes bidirectionally; a parasitic capacitance buffer circuit being operably connected to parasitic diodes associated with isolating the P-wells of one or more transistors in the current limiter.

2. The input buffer circuit of claim 1, further comprising:

a parasitic capacitance buffer circuit being operably connected to parasitic diodes associated with isolating the P-wells of one or more transistors in the current limiter.

3. The input circuit of claim 1 further comprising:

a third transistor being operably connected to the input;

a fourth transistor being operably connected to the third transistor;

a fifth transistor being operably connected to the fourth transistor; and, a means for biasing being operably connected to the fourth and fifth transistors so as to provide a bias current to the third transistor of the parasitic capacitance buffer circuit, wherein parasitic capacitance associated with isolation of the p-well of the first and second transistors is buffered from the transducer input terminal.

4. The input buffer circuit of claim 3 wherein the third, fourth, and fifth transistors are of an Enhancement PMOS type.

5. The input buffer circuit of claim 1 wherein the input transistor is a Depletion NMOS type.

6. The input buffer circuit of claim 1 wherein the first transistor is a natural NMOS type.

7. The input buffer circuit of claim 1 wherein the second transistor is a Natural NMOS type.

8. The input buffer circuit of claim 1 wherein the second transistor is a Natural NMOS type.

* * * * *

UNITED STATES PATENT AND TRADEMARK OFFICE
CERTIFICATE OF CORRECTION

PATENT NO. : 7,221,766 B2 Page 1 of 1
APPLICATION NO. : 10/411556
DATED : May 22, 2007
INVENTOR(S) : Steven E. Boor It is certified that error appears in the above-identified patent and that said Letters Patent is hereby corrected as shown below:

In the Claims:

At Column 5, line 11, "comprise" should be -- comprises --.

At Column 5, lines 18-21, please delete "2. The input buffer circuit of claim 1, further comprising:
A parasitic capacitance buffer circuit being operably connected to parasitic diodes associated with isolating the P-wells of one or more transistors in the current limiter." as this claim was canceled in the Examiner's Amendment.

Signed and Sealed this

Thirteenth Day of May, 2008

JON W. DUDAS
*Director of the United States Patent and Trademark Office*